(12) United States Patent
He et al.

(10) Patent No.: US 12,041,825 B2
(45) Date of Patent: Jul. 16, 2024

(54) ORGANIC ELECTROLUMINESCENT DISPLAY SUBSTRATE AND MANUFACTURING METHOD, DISPLAY PANEL AND DISPLAY DEVICE

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Xue Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 438 days.

(21) Appl. No.: 17/429,935

(22) PCT Filed: Nov. 13, 2020

(86) PCT No.: PCT/CN2020/128582
§ 371 (c)(1),
(2) Date: Aug. 10, 2021

(87) PCT Pub. No.: WO2022/099587
PCT Pub. Date: May 19, 2022

(65) Prior Publication Data
US 2022/0352283 A1 Nov. 3, 2022

(51) Int. Cl.
*H10K 59/13* (2023.01)
*H10K 59/124* (2023.01)
(Continued)

(52) U.S. Cl.
CPC ........... *H10K 59/13* (2023.02); *H10K 59/124* (2023.02); *H10K 59/126* (2023.02); *H10K 59/38* (2023.02); *H10K 71/00* (2023.02); *H10K 59/1201* (2023.02)

(58) Field of Classification Search
CPC .... H10K 59/13; H10K 59/124; H10K 59/126; H10K 59/38; H10K 59/60; H10K 71/00
See application file for complete search history.

(56) References Cited

U.S. PATENT DOCUMENTS

| 2014/0175394 A1 | 6/2014 | Kum et al. |
| 2015/0207094 A1 | 7/2015 | Hwang |

(Continued)

FOREIGN PATENT DOCUMENTS

| CN | 109300944 A | 2/2019 |
| CN | 110047906 A | 7/2019 |

(Continued)

*Primary Examiner* — Thanh Y. Tran
(74) *Attorney, Agent, or Firm* — IPro, PLLC

(57) ABSTRACT

An organic electroluminescent display substrate is provided, which includes a base substrate, and a light-emitting unit and a light-sensing unit arranged on the base substrate, wherein the light-sensing unit is arranged on a light-emitting side of the light-emitting unit, and configured for sensing an intensity of light emitted from the light-emitting unit; a first planarization layer is arranged between the light-sensing unit and the light-emitting unit; the light-sensing unit comprises a first thin film transistor and a photosensitive sensor arranged sequentially in that order in a direction away from the base substrate, and a second planarization layer is arranged between the photosensitive sensor and the first thin film transistor. A display panel, a display device and a method for manufacturing the organic electroluminescent display substrate are further provided.

18 Claims, 3 Drawing Sheets

(51) Int. Cl.
  *H10K 59/126* (2023.01)
  *H10K 59/38* (2023.01)
  *H10K 71/00* (2023.01)
  *H10K 59/12* (2023.01)

(56) References Cited

U.S. PATENT DOCUMENTS

2020/0098839 A1    3/2020  Xu et al.
2021/0036068 A1*   2/2021  Zhao .................... H10K 59/124
2021/0408095 A1   12/2021  Zhou et al.

FOREIGN PATENT DOCUMENTS

| CN | 110634890 A | 12/2019 |
| CN | 110808272 A | 2/2020 |
| CN | 110867473 A | 3/2020 |
| CN | 110998855 A | 4/2020 |
| CN | 111509014 A | 8/2020 |
| CN | 111653602 A | 9/2020 |
| KR | 20190061823 A | 6/2019 |
| WO | 2021087667 A1 | 5/2021 |

* cited by examiner

ORGANIC ELECTROLUMINESCENT DISPLAY SUBSTRATE AND MANUFACTURING METHOD, DISPLAY PANEL AND DISPLAY DEVICE

CROSS-REFERENCE TO RELATED APPLICATION

This application is the U.S. national phase of PCT Application No. PCT/CN2020/128582 filed on Nov. 13, 2020, the entire contents of which are incorporated herein by reference.

TECHNICAL FIELD

The present disclosure relates to the technical field of manufacturing display products, and more particularly to an organic electroluminescent display substrate, a manufacturing method, a display panel and a display device.

BACKGROUND

Organic Light-Emitting Diode (OLED) display products have been developed over a long period of time, have been developed rapidly in the recent years, and have gradually emerged in terminal products. There are still some technical problems in OLED displays, such as brightness compensation. The common compensation method is in electrical compensation, but due to the limited effect of the electrical compensation method, an optical compensation method is proposed. By adding a photosensitive sensor in the pixel, the intensity of OLED light emission is sensed, and the signal detected by the photosensitive sensor is fed back to the OLED pixel driving circuit, so as to realize corresponding compensation. In the process of realizing such an optical compensation method, after the photosensitive sensor process is completed, since it is necessary to ensure the quality of the film and ensure that the film is thick, the deposition time thereof usually takes 10-30 minutes, and the deposition gas is mainly SiH4 and H2, i.e. being in an environment of H, and under an H atmosphere for 10-30 minutes, the metal oxide semiconductor is easily conducted, which may adversely affect the device. A metal oxide semiconductor Thin Film Transistor (TFT) is substantially in a large current state, and is difficult to return to its original state in a subsequent process.

SUMMARY

In order to solve the above-mentioned technical problem, the present disclosure provides an organic electroluminescent display substrate, a manufacturing method, a display panel and a display device, to solve a problem of generating a dark current when a photosensitive sensor is used to sense an intensity of light emitted from a light-emitting unit.

In order to achieve the above object, embodiments of the present disclosure adopt the following technical solutions. An organic electroluminescent display substrate is provided, which includes a base substrate, a light-emitting unit and a light-sensing unit, wherein the light-emitting unit and the light-sensing unit are arranged on the base substrate, the light-sensing unit is arranged on a light-emitting side of the light-emitting unit, and configured for sensing an intensity of light emitted from the light-emitting unit;

a first planarization layer is arranged between the light-sensing unit and the light-emitting unit;

the light-sensing unit includes a first thin film transistor and a photosensitive sensor arranged sequentially in that order in a direction away from the base substrate, and a second planarization layer is arranged between the photosensitive sensor and the first thin film transistor.

Optionally, the photosensitive sensor includes a first electrode, a light sensitive layer and a second electrode arranged sequentially in that order in the direction away from the base substrate, the first electrode is connected to a first terminal of the first thin film transistor through a via hole penetrating through the second planarization layer, and the second electrode is electrically connected to an external circuit through a wire.

Optionally, a first passivation layer is arranged between the second planarization layer and the first thin film transistor, a second passivation layer is arranged between the second planarization layer and the photosensitive sensor, and via holes through which the first electrode passes to connect to the first thin film transistor are arranged respectively in the first passivation layer and the second passivation layer.

Optionally, an orthographic projection of the second planarization layer onto the base substrate covers an entirety of a display area of the base substrate.

Optionally, an area of an orthographic projection of the second planarization layer onto the base substrate is greater than or equal to an area of an orthographic projection of the photosensitive sensor onto the base substrate.

Optionally, an orthographic projection of the light-sensing unit onto the base substrate partially overlaps with an orthographic projection of the light-emitting unit on the base substrate.

Optionally, a third passivation layer is arranged between the light-sensing unit and the first planarization layer.

Optionally, the light-emitting unit includes a third electrode, a fourth electrode and a light-emitting functional layer arranged between the third electrode and the fourth electrode, and a pixel circuit layer is further arranged on the base substrate, and the pixel circuit layer includes a second thin film transistor configured for providing a driving signal to the light-emitting unit.

Optionally, the first thin film transistor and the second thin film transistor are arranged in a same layer.

Optionally, the organic electroluminescent display substrate further includes a color film layer arranged on the light-emitting side of the light-emitting unit.

Optionally, a light shielding layer is arranged between the base substrate and the pixel circuit layer.

Embodiments of the present disclosure further provide a display panel including the above-mentioned organic electroluminescent display substrate.

Embodiments of the present disclosure further provide a display device including the above-mentioned display substrate.

Embodiments of the present disclosure further provide a method for manufacturing the above-mentioned organic electroluminescent display substrate, including:
  forming the first thin film transistor on the base substrate;
  forming the second planarization layer on the first thin film transistor;
  forming the photosensitive sensor on the second planarization layer;
  forming the first planarization layer on the photosensitive sensor;
  forming the light-emitting unit on the first planarization layer.

Optionally, the method further includes: after forming the second planarization layer on the first thin film transistor, forming a second passivation layer on the second planarization layer.

Advantageous effects of the present disclosure are as follows. A second planarization layer is arranged between the light-sensing unit and the first thin film transistor, to ensure that a bottom of the light-sensing unit is flat, which may facilitate to reduce the dark current of the light-sensing unit, ensure characteristics of the first thin film transistor, and suppress the occurrence of the case where the first thin film transistor generates a large current.

DETAILED DESCRIPTION

Figure 1:
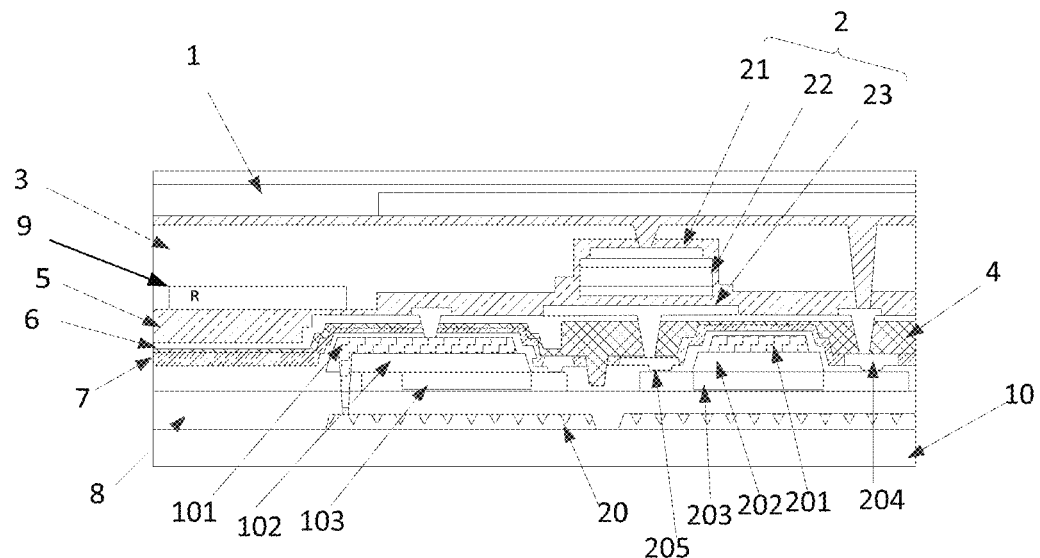
FIG. 1 is a first structure schematic diagram of an organic electroluminescent display substrate according to an embodiment of the present disclosure.

To further clarify the objects, technical solutions and advantages of the embodiments of the present disclosure, a more particular description of the technical solutions of the present disclosure will be rendered by reference to the drawings. Obviously, the embodiments described in the present disclosure are part, rather than all of the embodiments of the present disclosure. Based on the embodiments in the present disclosure, all other embodiments obtained by a person of ordinary skill in the art are within the protection scope of the present disclosure.

In the description of the present disclosure, it should be understood that the orientation or positional relationship indicated by the terms "center", "upper", "lower", "left", "right", "vertical", "horizontal", "inner", "outer", and the like is based on the orientation or positional relationship shown in the drawings, and is merely for convenience of describing the disclosure and simplifying the description, but not intended or implied that the referenced device or element must have a particular orientation, be constructed and operated in a particular orientation, and thus should not be construed as limiting the present disclosure. In addition, the terms "first", "second" and "third" are used for descriptive purposes only and are not to be construed as indicating or implying relative importance.

Figure 2:
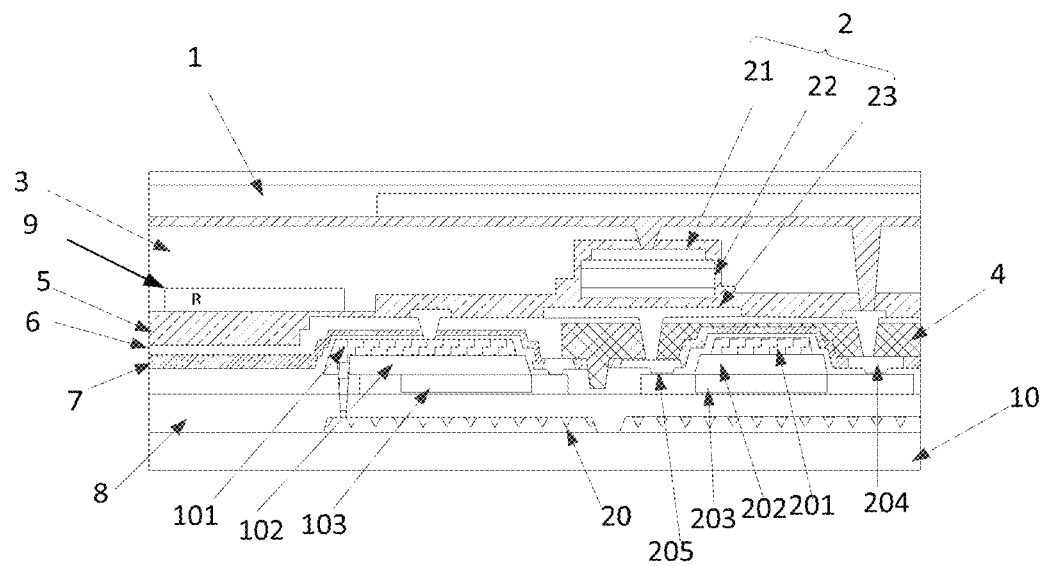
FIG. 2 is a second structure schematic diagram of an organic electroluminescent display substrate according to an embodiment of the present disclosure.

Referring to FIGS. 1 and 2, this embodiment provides an organic electroluminescent display substrate, comprising a base substrate 10, and a light-emitting unit 1 and a light-sensing unit 2 arranged on the base substrate 10, wherein the light-sensing unit 2 is arranged on a light-emitting side of the light-emitting unit 1 and configured for sensing an intensity of light emitted from the light-emitting unit 1;

a first planarization layer 3 is arranged between the light-sensing unit 2 and the light-emitting unit 1;

the light-sensing unit 2 comprises a first thin film transistor and a photosensitive sensor arranged sequentially in that order in a direction away from the base substrate 10, and a second planarization layer 4 is arranged between the photosensitive sensor and the first thin film transistor.

Figure 3:
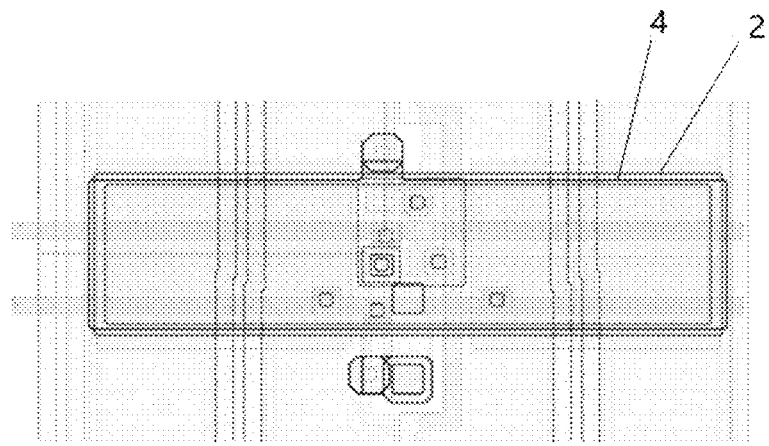
FIG. 3 is a partial structure schematic diagram of an organic electroluminescent display substrate according to an embodiment of the present disclosure.

A second planarization layer 4 is arranged between the photosensitive sensor and the first thin film transistor, and forms a double planarization layer structure with the first planarization layer 3, so as to reduce the dark current of the light-sensing unit 2, ensure the characteristics of the first thin film transistor, and suppress the occurrence of the case where the first thin film transistor generates a large current. By comparing FIG. 3 with FIG. 5 and FIG. 6, the case where the first thin film transistor generates a large current is significantly suppressed after the second planarization layer is arranged in this embodiment.

In this embodiment, the second planarization layer 4 is a resin layer, but not limited thereto.

The resin layer contains at least one chemical organic substance, and achieves a hydrogen resistance effect through interaction or reaction between the organic substances, and the specific species of the substance can be selected according to actual needs as long as the second planarization layer reaches the conditions that the curing temperature is less than 260 degrees centigrade and the thermal decomposition temperature is greater than 450 degrees centigrade. For example, the organic substance can be a hydrogen resistance additive.

Illustratively in this embodiment, the photosensitive sensor comprises a first electrode 21, a light sensitive layer 22, and a second electrode 23 arranged sequentially in that order in a direction away from the base substrate 10, the first electrode 21 is connected to a first terminal of the first thin film transistor through a via hole passing through the second planarization layer 4, and the second electrode 23 is electrically connected to an external circuit through a wire.

Illustratively in this embodiment, the photosensitive sensor is a photodiode.

Illustratively in this embodiment, a first passivation layer 7 is arranged between the second planarization layer 4 and the first thin film transistor, a second passivation layer 6 is arranged between the second planarization layer 4 and the photosensitive sensor, and via holes through which the first electrode 21 passes to connect to the first thin film transistor are arranged respectively in the first passivation layer 7 and the second passivation layer 6.

The first passivation layer 7 serves to isolate and protect the first thin film transistor, and the second passivation layer 6 is arranged so as to prevent the second planarization layer 4 from being etched due to over-etching in an etching process when the light-sensing unit 2 is formed.

In this embodiment, the second planarization layer 4 is arranged to reduce the dark current generated by the photosensitive sensor and to prevent the first thin film transistor from being adversely affected in an H environment during the manufacturing of the photosensitive sensor. Therefore, it is only necessary that the area of the second planarization layer 4 is not smaller than the area of the photosensitive sensor. Namely, the orthographic projection of the second planarization layer 4 onto the base substrate 10 is at least equal to the orthographic projection of the photosensitive sensor onto the base substrate 10.

Illustratively in this embodiment, an orthographic projection of the second planarization layer 4 onto the base substrate 10 covers an entirety of the display area of the base substrate 10, with reference to FIG. 1. Illustratively in this embodiment, the second planarization layer is of an island structure arranged only below the photosensitive sensor, and the area of the orthographic projection of the second planarization layer 4 onto the base substrate 10 is greater than or equal to the area of the orthographic projection of the photosensitive sensor onto the base substrate 10. When the area of the orthographic projection of the second planarization layer 4 onto the base substrate 10 is larger than the area of the orthographic projection of the photosensitive sensor onto the base substrate 10, the difference between the area of the orthographic projection of the second planarization layer 4 onto the base substrate 10 and the area of the orthographic projection of the photosensitive sensor onto the base substrate 10 is less than a preset value (the preset value can be set according to practical requirements), with reference to FIGS. 2 and 3.

It should be noted that both the arrangement of the second planarization layer shown in FIG. 1 and the arrangement of the second planarization layer shown in FIG. 2 can reduce the dark current of the light-sensing unit 2, ensure the characteristics of the first thin film transistor, and prevent the first thin film transistor from generating a large current. However, it is preferable in this embodiment that the orthographic projection of the second planarization layer 4 onto the base substrate 10 covers the entirety of the display area of the base substrate 10 for the following reasons.

Figure 5:
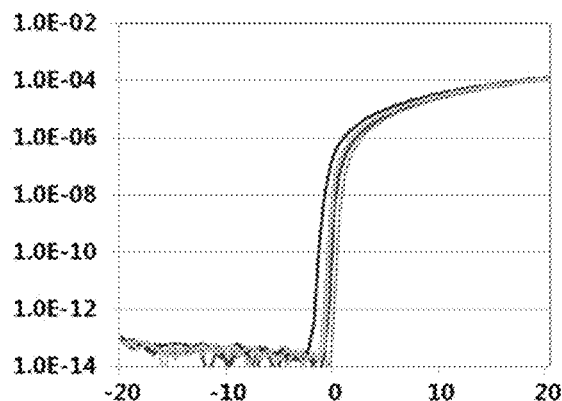
FIG. 5 is a first IV schematic diagram of a first thin film transistor according to an embodiment of the present disclosure.
Figure 6:
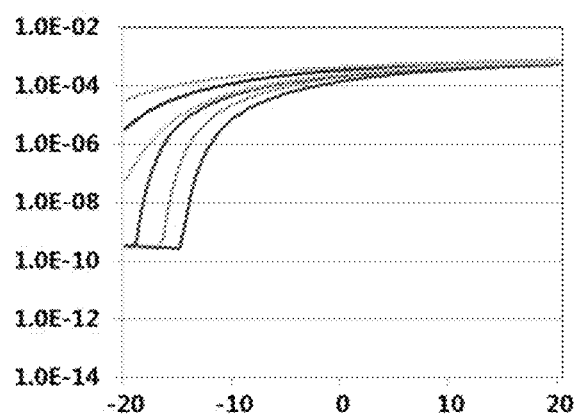
FIG. 6 is a second IV schematic diagram of a first thin film transistor according to an embodiment of the present disclosure.
Figure 7:
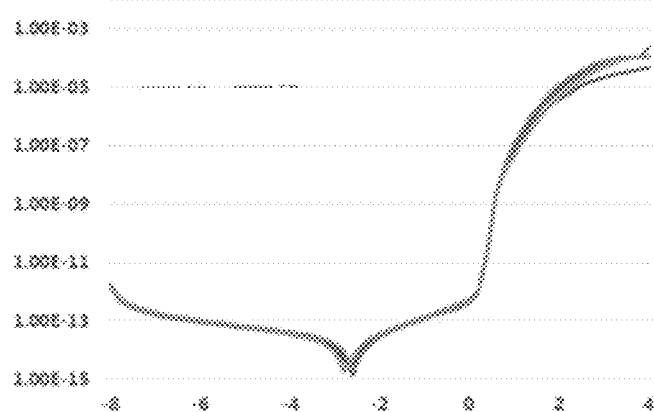
FIG. 7 is an IV schematic diagram showing a dark current generated by a light-sensing unit according to an embodiment of the present disclosure.

FIG. 5 is an IV schematic diagram of the first thin film transistor when the orthographic projection of the second planarization layer 4 onto the base substrate 10 covers the entirety of the display area of the base substrate 10, and FIG. 6 is an IV schematic diagram of the first thin film transistor when the second planarization layer is of an island structure and is arranged only below the photosensitive sensor. FIG. 7 is an IV diagram showing a dark current generated by a light-sensing unit when an orthographic projection of the second planarization layer 4 onto the base substrate 10 covers an entirety of a display area of the base substrate 10.

In FIGS. 5 and 6, an ordinate indicates a current and an abscissa indicates a voltage, and for a thin film transistor in a normal state, a voltage is applied to the thin film transistor and the thin film transistor is turned on to generate a current, and as the voltage increases, the current gradually tends to be stabilized while no current is generated without applying the voltage. It can be seen from FIGS. 5 and 6 that the orthographic projection of the second planarization layer 4 onto the base substrate 10 covers the entirety of the display area of the base substrate 10, i.e. the second planarization layer integrally covers the entire base substrate, as shown in FIG. 5 (in FIG. 5, the current curve corresponding to a negative voltage can be ignored since the current is very small). Therefore, the case where the first thin film transistor generates a large current is avoided. However, in FIG. 6, although the case where the first thin film transistor generates a large current is suppressed as compared with the IV schematic diagram shown in FIG. 4. However, since the first planarization layer is arranged only directly below the light-sensing unit, there is a portion of H entering the first thin film transistor below during the process of manufacturing the light-sensing unit, thereby adversely affects the characteristics of the first thin film transistor. Since the thin film transistor is caused to generate a current without applying a voltage, it is preferable in this embodiment that the orthographic projection of the second planarization layer 4 onto the base substrate 10 covers the entirety of the display area of the base substrate 10.

Figure 4:
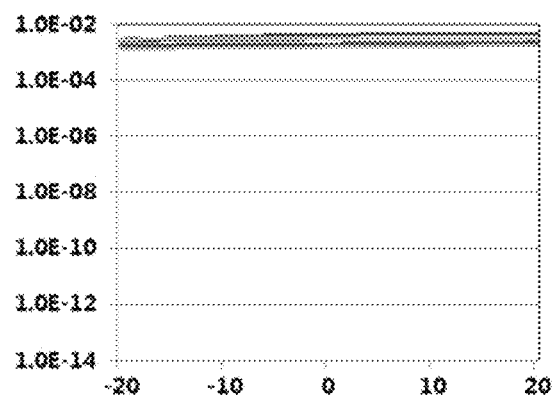
FIG. 4 is an IV schematic diagram of a first thin film transistor in the related art.

It should be noted that the different curves in FIGS. 4-6 are different patterns obtained by testing at different locations on the base substrate.

FIG. 7 is a schematic diagram of a dark current generated by a photosensitive sensor when an orthographic projection of the second planarization layer 4 onto the base substrate 10 covers an entirety of a display area of the base substrate 10. In general, when a voltage of −4v is provided, the dark current generated by the photosensitive sensor may be required to be less than 1.00E-9. It can be obtained from FIG. 7 that when a voltage of −4v is supplied, as long as the dark current generated by the photosensitive sensor is less than 1.00E-13, 1.00E-14 can be achieved, the dark current generated by the photosensitive sensor can be reduced. A plurality of display panels are arranged on one glass substrate; the different curves in FIG. 7 are graphs obtained by testing the dark current of each of the photosensitive sensors on the plurality of display panels; and it can be obtained from FIG. 7 that the arrangement of the second planarization layer improves the uniformity of the display panels.

Illustratively in this embodiment, the orthographic projection of the light-sensing unit 2 onto the base substrate 10 partially coincides with the orthographic projection of the light-emitting unit 1 onto the base substrate 10.

The light-sensing unit 2 is located at the light-emitting side of the light-emitting unit 1, and the light-sensing unit 2 partially overlaps the light-emitting unit 1, that is, the orthographic projection of the light-sensing unit 2 onto the base substrate 10 partially coincides with the orthographic projection of the light-emitting unit 1 onto the base substrate 10, so that part of the light emitted from the light-emitting unit 1 can be sensed by the light-sensing unit 2.

Illustratively in this embodiment, a third passivation layer 5 is arranged between the light-sensing unit 2 and the first planarization layer 3.

The third passivation layer 5 is formed on the photosensitive sensor to isolate and protect the photosensitive sensor.

Illustratively in this embodiment, the light-emitting unit 1 comprises a third electrode, a fourth electrode, and a light-emitting functional layer arranged between the third electrode and the fourth electrode, and a pixel circuit layer is further arranged on the base substrate 10, and the pixel circuit layer comprises a second thin film transistor for providing a driving signal to the light-emitting unit 1.

Illustratively in this embodiment, the first thin film transistor and the second thin film transistor are arranged in the same layer.

Illustratively in this embodiment, the organic electroluminescent display substrate further comprises a color filter 9 arranged on the light-emitting side of the light-emitting unit 1.

The color filter 9 comprises a plurality of color resistance layers, and each of the light-emitting units 1 corresponds to a respective one of color resistance layers having a respective color, and R, namely, a red color resistance layer is represented in FIGS. 1 and 2, and a green color resistance layer (G) or a blue color resistance layer (B) can alternatively be represented. After passing through the color filter 9, the light emitted from the light-emitting unit achieves color display.

Illustratively in this embodiment, a light shielding layer 20 is arranged between the base substrate 10 and the pixel circuit layer.

The organic electroluminescent display substrate in this embodiment is a bottom-emitting display device, and the light-shielding layer 20 is arranged on the base substrate 10 to prevent ambient light from adversely affecting the second thin film transistor.

Illustratively in this embodiment, the light shielding layer 20 is a metal layer, the second thin film transistor comprises a second active layer 103, a second gate insulation layer 102 and a second gate electrode 101, a buffer layer 8 is arranged between the light shielding layer 20 and the second active layer 103, and the light shielding layer 20 is connected to the second gate electrode 101 of the second thin film transistor to constitute a double-gate structure. The top-gate structure is susceptible to substrate glass impurities, but the double-gate TFT can ensure that the characteristics of the gate electrode in the second thin film transistor are not adversely affected, thereby ensuring the stability of the TFT.

Embodiments of the present disclosure further provide a display device comprising the organic electroluminescent display substrate described above.

Embodiments of the present disclosure provide a method for manufacturing the organic electroluminescent display substrate described above, comprising the following steps:
- forming a first thin film transistor on the base substrate 10, and forming an active layer (first active layer 203), a gate insulation layer (first gate insulation layer 202), a gate electrode (first gate electrode 201) and a source-drain pattern (source electrode 205 and drain electrode 204) on the base substrate 10 sequentially in that order;
- forming a second planarization layer 4 on the first thin film transistor;
- forming a photosensitive sensor on the second planarization layer 4, and forming a first electrode 21, a light sensitive layer 22 and a second electrode 23 on the second planarization layer 4 sequentially in that order;
- forming a first planarization layer 3 on the photosensitive sensor; and
- forming a light-emitting unit 1 on the first planarization layer 3.

Illustratively in this embodiment, the method further comprises: after forming the second planarization layer 4 on the first thin film transistor,
- forming a second passivation layer 6 on the second planarization layer 4.

It should be appreciated that the above-described embodiments are merely illustrative embodiments that have been employed to illustrate the principles of the present disclosure, and that the present disclosure is not limited thereto. A person of ordinary skill in the art understands that various modifications and improvements can be made without departing from the spirit and scope of the present disclosure.

What is claimed is:

1. An organic electroluminescent display substrate, comprising a base substrate, a light-emitting unit and a light-sensing unit, wherein the light-emitting unit and the light-sensing unit are arranged on the base substrate, the light-sensing unit is arranged on a light-emitting side of the light-emitting unit, and configured for sensing an intensity of light emitted from the light-emitting unit;
   a first planarization layer is arranged between the light-sensing unit and the light-emitting unit;
   the light-sensing unit comprises a first thin film transistor and a photosensitive sensor arranged sequentially in that order in a direction away from the base substrate, and a second planarization layer is arranged between the photosensitive sensor and the first thin film transistor,
   wherein the photosensitive sensor comprises a first electrode, a light sensitive layer and a second electrode arranged sequentially in that order in the direction away from the base substrate, the first electrode is connected to a first terminal of the first thin film transistor through a via hole penetrating through the second planarization layer, and the second electrode is electrically connected to an external circuit through a wire.

2. The organic electroluminescent display substrate according to claim 1, wherein a first passivation layer is arranged between the second planarization layer and the first thin film transistor, a second passivation layer is arranged between the second planarization layer and the photosensitive sensor, and via holes through which the first electrode passes to connect to the first thin film transistor are arranged respectively in the first passivation layer and the second passivation layer.

3. The organic electroluminescent display substrate according to claim 1, wherein an orthographic projection of the second planarization layer onto the base substrate covers an entirety of a display area of the base substrate.

4. The organic electroluminescent display substrate according to claim 1, wherein an area of an orthographic projection of the second planarization layer onto the base substrate is greater than or equal to an area of an orthographic projection of the photosensitive sensor onto the base substrate.

5. The organic electroluminescent display substrate according to claim 1, wherein an orthographic projection of the light-sensing unit onto the base substrate partially overlaps with an orthographic projection of the light-emitting unit on the base substrate.

6. The organic electroluminescent display substrate according to claim 1, wherein a third passivation layer is arranged between the light-sensing unit and the first planarization layer.

7. The organic electroluminescent display substrate according to claim 1, wherein the light-emitting unit comprises a third electrode, a fourth electrode and a light-emitting functional layer arranged between the third electrode and the fourth electrode, and a pixel circuit layer is further arranged on the base substrate, and the pixel circuit layer comprises a second thin film transistor configured for providing a driving signal to the light-emitting unit.

8. The organic electroluminescent display substrate according to claim 7, wherein the first thin film transistor and the second thin film transistor are arranged in a same layer.

9. The organic electroluminescent display substrate according to claim 7, further comprising a color filter arranged on the light-emitting side of the light-emitting unit.

10. The organic electroluminescent display substrate according to claim 7, wherein a light shielding layer is arranged between the base substrate and the pixel circuit layer.

11. A display panel, comprising the organic electroluminescent display substrate according to claim 1.

12. A display device, comprising the display substrate according to claim 11.

13. The display panel according to claim 11, wherein a first passivation layer is arranged between the second planarization layer and the first thin film transistor, a second passivation layer is arranged between the second planarization layer and the photosensitive sensor, and via holes through which the first electrode passes to connect to the first thin film transistor are arranged respectively in the first passivation layer and the second passivation layer.

14. The display panel according to claim 11, wherein an orthographic projection of the second planarization layer onto the base substrate covers an entirety of a display area of the base substrate.

15. The display panel according to claim 11, wherein an area of an orthographic projection of the second planarization layer onto the base substrate is greater than or equal to an area of an orthographic projection of the photosensitive sensor onto the base substrate.

16. The display panel according to claim 11, wherein an orthographic projection of the light-sensing unit onto the base substrate partially overlaps with an orthographic projection of the light-emitting unit on the base substrate.

17. A method for manufacturing the organic electroluminescent display substrate according to claim 1, comprising:
   forming the first thin film transistor on the base substrate;
   forming the second planarization layer on the first thin film transistor;
   forming the photosensitive sensor on the second planarization layer;
   forming the first planarization layer on the photosensitive sensor;
   forming the light-emitting unit on the first planarization layer.

18. The method according to claim 17, further comprising: after forming the second planarization layer on the first thin film transistor,
   forming a second passivation layer on the second planarization layer.

* * * * *